(12) United States Patent
Wojtczak et al.

(10) Patent No.: US 7,192,910 B2
(45) Date of Patent: Mar. 20, 2007

(54) CLEANING SOLUTIONS AND ETCHANTS AND METHODS FOR USING SAME

(75) Inventors: William A. Wojtczak, Austin, TX (US); Dean Dewulf, Austin, TX (US); Sian Collins, Austin, TX (US)

(73) Assignee: Sachem, Inc., Austin, TX (US)

( * ) Notice: Subject to any disclaimer, the term of this patent is extended or adjusted under 35 U.S.C. 154(b) by 171 days.

(21) Appl. No.: 10/974,569

(22) Filed: Oct. 27, 2004

(65) Prior Publication Data
US 2005/0143270 A1   Jun. 30, 2005

Related U.S. Application Data

(60) Provisional application No. 60/515,065, filed on Oct. 28, 2003.

(51) Int. Cl.
*C11D 7/50* (2006.01)

(52) U.S. Cl. .......... 510/175; 510/176; 134/1.3; 134/3

(58) Field of Classification Search ............ None
See application file for complete search history.

(56) References Cited

U.S. PATENT DOCUMENTS

| | | |
|---|---|---|
| 3,979,241 A | 9/1976 | Maeda et al. |
| 4,582,624 A | 4/1986 | Enjo et al. |
| 4,613,560 A | 9/1986 | Dueber et al. |
| 4,803,145 A | 2/1989 | Suzuki et al. |
| 5,080,994 A | 1/1992 | Breton et al. |
| 5,175,078 A | 12/1992 | Aoyama et al. |
| 5,286,606 A | 2/1994 | Rahman et al. |
| 5,317,080 A | 5/1994 | Arimatsu et al. |
| 5,320,709 A | 6/1994 | Bowden et al. |
| 5,466,389 A | 11/1995 | Hardi et al. |
| 5,556,833 A | 9/1996 | Howe |
| 5,630,904 A | 5/1997 | Aoyama et al. |

(Continued)

FOREIGN PATENT DOCUMENTS

EP    0 405 464    1/1991

(Continued)

OTHER PUBLICATIONS

US 6,492,477, 12/2002, Savu et al. (withdrawn)

*Primary Examiner*—Gregory Webb
(74) *Attorney, Agent, or Firm*—Renner, Otto, Boisselle & Sklar, LLP

(57) ABSTRACT

Composition for cleaning or etching a semiconductor substrate and method for using the same. The composition may include a fluorine-containing compound as an active agent such as a quaternary ammonium fluoride, a quaternary phosphonium fluoride, sulfonium fluoride, more generally an -onium fluoride or "multi" quaternary -onium fluoride that includes two or more quaternary- onium groups linked together by one or more carbon-containing groups. The composition may further include a pH adjusting acid such as a mineral acid, carboxylic acid, dicarboxylic acid, sulfonic acid, or combination thereof to give a pH of about 2 to 9. The composition can be anhydrous and may further include an organic solvent such as an alcohol, amide, ether, or combination thereof. The composition are useful for obtaining improved etch rate, etch selectivity, etch uniformity and cleaning criteria on a variety of substrates.

30 Claims, 10 Drawing Sheets

U.S. PATENT DOCUMENTS

| | | | |
|---|---|---|---|
| 5,750,797 A | 5/1998 | Vitcak et al. | |
| 5,753,421 A | 5/1998 | Sato et al. | |
| 5,792,274 A | 8/1998 | Tanabe et al. | |
| 5,855,811 A | 1/1999 | Grieger et al. | |
| 5,905,063 A | 5/1999 | Tanabe et al. | 510/176 |
| 5,939,336 A | 8/1999 | Yates | |
| 5,955,222 A | 9/1999 | Hibbs | |
| 5,962,385 A * | 10/1999 | Maruyama et al. | 510/176 |
| 5,965,465 A | 10/1999 | Rath et al. | |
| 5,972,570 A | 10/1999 | Bruce et al. | |
| 5,972,862 A | 10/1999 | Torii et al. | |
| 5,976,768 A | 11/1999 | Brown et al. | |
| 5,981,147 A | 11/1999 | Hallock et al. | |
| 5,981,148 A | 11/1999 | Brown et al. | |
| 5,981,401 A | 11/1999 | Torek et al. | |
| 5,985,525 A | 11/1999 | Sato et al. | |
| 5,994,031 A | 11/1999 | Hirai et al. | |
| 6,007,968 A | 12/1999 | Furukawa et al. | |
| 6,014,422 A | 1/2000 | Boyd et al. | |
| 6,017,810 A | 1/2000 | Furukawa et al. | |
| 6,030,932 A | 2/2000 | Leon et al. | |
| 6,033,949 A | 3/2000 | Baker et al. | |
| 6,033,996 A | 3/2000 | Rath et al. | |
| 6,044,851 A | 4/2000 | Grieger et al. | |
| 6,057,080 A | 5/2000 | Brunsvold et al. | |
| 6,066,267 A | 5/2000 | Rath et al. | |
| 6,087,064 A | 7/2000 | Lin et al. | |
| 6,087,273 A | 7/2000 | Torek et al. | |
| 6,090,721 A | 7/2000 | Yates | |
| 6,100,013 A | 8/2000 | Brown et al. | |
| 6,114,082 A | 9/2000 | Hakey et al. | |
| 6,136,425 A | 10/2000 | Akiyama et al. | |
| 6,147,002 A | 11/2000 | Kneer | |
| 6,147,394 A | 11/2000 | Bruce et al. | |
| 6,150,282 A | 11/2000 | Rath et al. | |
| 6,177,282 B1 | 1/2001 | McIntyre | |
| 6,180,319 B1 | 1/2001 | McKeever | |
| 6,184,041 B1 | 2/2001 | Furukawa et al. | |
| 6,190,829 B1 | 2/2001 | Holmes et al. | |
| 6,197,733 B1 | 3/2001 | Mikami et al. | |
| 6,200,726 B1 | 3/2001 | Chen et al. | |
| 6,210,866 B1 | 4/2001 | Furukawa et al. | |
| 6,214,526 B1 | 4/2001 | Sundararajan et al. | |
| 6,218,704 B1 | 4/2001 | Brown et al. | |
| 6,221,704 B1 | 4/2001 | Furukawa et al. | |
| 6,224,785 B1 | 5/2001 | Wojtczak et al. | |
| 6,232,232 B1 | 5/2001 | Lee et al. | |
| 6,232,639 B1 | 5/2001 | Baker et al. | |
| 6,245,488 B1 | 6/2001 | Furukawa et al. | |
| 6,248,704 B1 * | 6/2001 | Small et al. | 510/176 |
| 6,254,796 B1 | 7/2001 | Rath et al. | |
| 6,255,178 B1 | 7/2001 | Brown et al. | |
| 6,261,745 B1 * | 7/2001 | Tanabe et al. | 430/331 |
| 6,265,309 B1 * | 7/2001 | Gotoh et al. | 438/637 |
| 6,277,543 B1 | 8/2001 | Furukawa et al. | |
| 6,280,651 B1 | 8/2001 | Wojtczak et al. | |
| 6,284,439 B1 | 9/2001 | Holmes et al. | |
| 6,306,775 B1 | 10/2001 | Li | |
| 6,310,018 B1 | 10/2001 | Behr et al. | |
| 6,313,492 B1 | 11/2001 | Hakey et al. | |
| 6,323,169 B1 | 11/2001 | Abe et al. | |
| 6,326,110 B1 | 12/2001 | Datta et al. | |
| 6,340,734 B1 | 1/2002 | Lin et al. | |
| 6,361,712 B1 | 3/2002 | Honda et al. | |
| 6,368,421 B1 | 4/2002 | Oberlander et al. | |
| 6,372,410 B1 * | 4/2002 | Ikemoto et al. | 430/318 |
| 6,372,412 B1 | 4/2002 | Hakey et al. | |
| 6,372,415 B1 | 4/2002 | Nomoto et al. | |
| 6,383,410 B1 | 5/2002 | Wojtczak et al. | |
| 6,383,651 B1 | 5/2002 | Weinert | |
| 6,391,426 B1 | 5/2002 | Hakey et al. | |
| 6,391,794 B1 | 5/2002 | Chen et al. | |
| 6,403,289 B1 | 6/2002 | Tanaka et al. | |
| 6,420,766 B1 | 7/2002 | Brown et al. | |
| 6,426,175 B2 | 7/2002 | Furukawa et al. | |
| 6,432,621 B1 | 8/2002 | Nomoto et al. | |
| 6,440,635 B1 | 8/2002 | Holmes et al. | |
| 6,444,588 B1 | 9/2002 | Holscher et al. | |
| 6,455,234 B1 | 9/2002 | Lassila et al. | |
| 6,468,915 B1 | 10/2002 | Liu | |
| 6,468,951 B1 | 10/2002 | Grieger et al. | |
| 6,475,966 B1 * | 11/2002 | Sahbari | 510/175 |
| 6,492,309 B1 | 12/2002 | Behr et al. | |
| 6,514,352 B2 | 2/2003 | Gotoh et al. | |
| 6,534,458 B1 | 3/2003 | Kakizawa et al. | |
| 6,548,602 B2 | 4/2003 | Foreman et al. | |
| 6,554,912 B2 | 4/2003 | Sahbari | |
| 6,573,175 B1 | 6/2003 | Yin et al. | |
| 6,589,439 B2 | 7/2003 | Honda et al. | |
| 6,592,777 B2 * | 7/2003 | Chen et al. | 252/79.1 |
| 6,605,863 B2 | 8/2003 | Yin et al. | |
| 6,666,986 B1 * | 12/2003 | Vaartstra | 252/79.1 |
| 6,703,319 B1 * | 3/2004 | Yates et al. | 438/745 |
| 6,762,132 B1 | 7/2004 | Yates | 438/745 |
| 6,777,380 B2 * | 8/2004 | Small et al. | 510/176 |
| 6,831,048 B2 * | 12/2004 | Kezuka et al. | 510/175 |
| 6,890,391 B2 * | 5/2005 | Aoki et al. | 134/32 |
| 6,890,865 B2 | 5/2005 | Yin et al. | 438/751 |
| 6,916,772 B2 * | 7/2005 | Zhou et al. | 510/201 |
| 6,967,169 B2 * | 11/2005 | Wojtczak et al. | 438/710 |
| 2001/0003034 A1 | 6/2001 | Furukawa et al. | |
| 2001/0003289 A1 | 6/2001 | Mead et al. | |
| 2001/0021577 A1 | 9/2001 | Brown et al. | |
| 2001/0051689 A1 | 12/2001 | Foreman et al. | |
| 2002/0037820 A1 * | 3/2002 | Small et al. | 510/175 |
| 2002/0043644 A1 | 4/2002 | Wojtczak et al. | |
| 2002/0106589 A1 | 8/2002 | Rodney et al. | |
| 2002/0134684 A1 | 9/2002 | Calvert et al. | |
| 2002/0137357 A1 | 9/2002 | Chen et al. | |
| 2002/0139387 A1 | 10/2002 | Yates | |
| 2002/0173587 A1 | 11/2002 | Lamola et al. | |
| 2002/0182241 A1 | 12/2002 | Borenstein et al. | |
| 2002/0182633 A1 | 12/2002 | Chen et al. | |
| 2003/0003406 A1 | 1/2003 | Crunwald et al. | |
| 2003/0003762 A1 | 1/2003 | Cotte et al. | |
| 2003/0004075 A1 | 1/2003 | Suto et al. | |
| 2003/0017962 A1 | 1/2003 | Naghshineh et al. | 510/499 |
| 2003/0022800 A1 | 1/2003 | Peters et al. | |
| 2003/0078173 A1 | 4/2003 | Wojtczak et al. | |
| 2003/0102532 A1 | 6/2003 | Yin et al. | |
| 2003/0114014 A1 | 6/2003 | Yokoi et al. | |
| 2003/0117962 A1 | 6/2003 | Mattson et al. | |
| 2003/0130149 A1 * | 7/2003 | Zhou et al. | 510/176 |
| 2003/0148910 A1 | 8/2003 | Peters et al. | |
| 2004/0029753 A1 | 2/2004 | Ikemoto et al. | |
| 2004/0038840 A1 * | 2/2004 | Lee et al. | 510/202 |
| 2004/0063042 A1 | 4/2004 | Egbe | |
| 2004/0245644 A1 | 12/2004 | Yin et al. | 257/758 |
| 2005/0143270 A1 * | 6/2005 | Wojtczak et al. | 510/175 |
| 2005/0176603 A1 * | 8/2005 | Hsu | 510/175 |
| 2005/0202987 A1 * | 9/2005 | Small et al. | 510/175 |

FOREIGN PATENT DOCUMENTS

| | | |
|---|---|---|
| EP | 0 522 990 | 1/1993 |
| EP | 0 564 389 | 10/1993 |
| EP | 0 662 705 | 7/1995 |
| EP | 0 669 646 | 8/1995 |
| EP | 0 678 201 | 10/1995 |
| EP | 0 679 265 | 3/1996 |
| EP | 0 749 594 | 12/1996 |
| EP | 0 677 183 | 2/1997 |
| EP | 0 762 208 | 3/1997 |
| EP | 0 827 188 | 3/1998 |

| | | | | | |
|---|---|---|---|---|---|
| EP | 0 901 160 | 3/1999 | EP | 1447440 | 8/2004 |
| EP | 0 522 457 | 11/1999 | JP | 10-319606 | 12/1998 |
| EP | 1035446 | 9/2000 | JP | 10319606 | 12/1998 |
| EP | 1 079 411 | 2/2001 | WO | WO 94/15262 | 7/1994 |
| EP | 1 091 254 | 4/2001 | WO | WO 95/12836 | 5/1995 |
| EP | 1 115 035 | 7/2001 | WO | WO 95/12837 | 5/1995 |
| EP | 1 168 424 | 1/2002 | WO | WO 95/24674 | 9/1995 |
| EP | 0 853 132 | 6/2002 | | | |
| EP | 1 321 510 | 6/2003 | | | |

* cited by examiner

Back End Clean Metal

Back End Clean Via

CLEANING SOLUTIONS AND ETCHANTS AND METHODS FOR USING SAME

RELATED APPLICATIONS

This application claims priority to U.S. Provisional Application No. 60/515,065, filed Oct. 28, 2003.

FIELD OF THE INVENTION

The present invention generally relates to compositions useful for etching various types of silicon oxide and oxynitrides. The compositions are also useful for cleaning residues from semiconductor substrates.

BACKGROUND OF THE INVENTION

Selective etching and cleaning solutions for dielectric antireflective coatings (DARC), pre-metal contacts comprised of undoped tetraethylorthosilicate (TEOS) and thermal oxides, and doped phospho- and boro-phospho-silicate glasses (PSG & BPSG) and low-k dielectric/copper interconnect structures are important to device design and manufacturing for the most advanced semiconductor technologies. Such process chemicals enable processing advances such as reduction of critical dimension and lower resistivity and capacitance contacts and interconnect.

DARC films, and more generally antireflective coatings (ARC's), are used to minimize undesirable surface layer reflections during photolithography and in so doing provide better pattern definition. DARC films are also employed in Advanced Patterning Technology with amorphous carbon films to extend and enhance existing photolithography to pattern smaller geometry structures. However, it is generally necessary to selectively remove these films after photolithography or plasma etch by either a wet chemical or plasma method.

Both undoped and doped silicon oxides are used as dielectric materials in pre-metal contacts down to doped silicon, polysilicon, and suicides. After plasma etch to open the contact, a contact clean chemistry is applied to selectively remove residues and provide a clean and conductive contact surface while maintaining the contact profile and critical dimension.

Additionally, compositions for removing photoresist and etch residues following plasma etch and ash processes are crucial for optimum electrical performance, reliability, and yield in integrated circuit manufacturing. Back end of line (BEOL) cleaning chemicals need to be capable of cleaning organic, organometallic, and inorganic post etch and post ash residues from copper and aluminum interconnect while not etching the interconnect metal or altering silicon dioxide or low-k dielectrics and their associated materials.

Presently, aqueous and non-aqueous fluoride formulations are used in selective etching and cleaning applications. These compositions are generally comprised of a fluoride component, additives, and a solvent, in many instances water. In selective etch applications, etch rates of many fluoride containing compositions are generally high, requiring very short process times. In addition, the varying stoichiometry of the films to be etched may result in a non-uniform etch that manifests as small islands of film remaining on the substrate surface as depicted in FIG. 1 for the DARC ($Si_xO_yN_z$) selective etchant application. What is needed is an improved etchant composition having improved etch rate, etch selectivity, and etch uniformity criteria on different types of substrates.

Fluoride chemistries, particularly HF/$NH_4F$ buffered oxide etch (BOE) and dilute HF, are also widely used for pre-metal contact cleaning. The high silicon oxide etch rates and narrow selectivity properties limit their use in applications where contact CD is below 0.18 μm, aspect ratio is greater than 10:1, and contact architecture uses complex material stacks as depicted in FIGS. 2A & 2B. A fluoride solution that has lower oxide etch rate than BOE or HF, adjustable oxide etch rate selectivity, and good residue removal activity is needed.

Formulations containing various amounts and types of fluoride additives have been used for BEOL cleans particularly when interconnect features are comprised of copper, low-k dielectric and associated materials as depicted in FIG. 3A, and they are also useful for aluminum interconnect systems such as shown in FIG. 3B. Fluoride chemistries are active in dissolving metal oxide and halide residues that are generated from the plasma etch of the interconnect material stack. However, many existing fluoride chemicals will also etch or chemically modify the silicon oxide and low-k dielectrics. This results in undesirable critical dimension enlargement and an increase in dielectric constant.

SUMMARY OF THE INVENTION

It has been found that formulations containing quaternary ammonium, phosphonium, and/or sulfonium fluoride salt, a relatively low water content, and a pH of 2–9 would be most compatible with silicon dioxide, low-k and porous low-k dielectrics, associated cap, barrier and etch stop materials, and metals such as copper and aluminum, which are used to construct interconnect features in integrated circuit manufacturing. Furthermore, it has been found that such formulations have high cleaning activity on post plasma etch and ash residues.

A cleaning or etching solution can be formulated by combining the following components in the amounts indicated below (by weight of the final composition):

(1) 0.1–20% by weight of a fluoride salt (preferably a quaternary ammonium, phosphonium or sulfonium);

(2) 0–5% by weight of a quaternary ammonium or phosphonium salt;

(3) 0.1–5% by weight of a pH adjusting acid (e.g., mineral acid, carboxylic acid, sulfonic acid);

(4) 0–99.8% by weight of an organic solvent (e.g., alcohols, amides, ethers); and (5) 0–99.8% by weight of water.

In certain embodiments, the fluoride salt is present in an amount of 1–10%, water is present in an amount less than 5%, and the organic solvent makes up more than 80% of the total composition. The pH of the composition is preferably between about 2 and about 9.

The compositions of the present invention have been found to be useful in various semiconductor cleaning and etching processes. For example, the compositions can be used after patterning a semiconductor substrate that includes a dielectric antireflective coating (DARC). The compositions can be used to selectively etch the DARC after it has been applied to the substrate. The etching composition is formulated to remove the DARC at a greater rate than it etches other layers on the substrate (e.g., amorphous carbon, BPSG, etc.).

The compositions of the present invention have also been found to be useful in pre-deposition and contact cleaning applications. For example, the compositions can be used to etch doped and undoped oxide layers with a 1:1 selectivity. Alternately, the compositions can be used to selectively etch these oxide layers such that the undoped oxide is removed at a rate that is between 2 and 10 times as fast as the rate at which the doped oxide is removed. The contact material can be a pre-metal contact material such as doped silicon, polysilicon, or silicide, or it can be a metal contact such as Cu or AlCu.

These compositions can also be used to remove the residue that is typically formed on contacts, vias, and metal lines when a dielectric or stack of dielectrics is etched to expose contact material. In this case, the cleaning formulation removes the post-etch residue while having little or no effect on the surrounding dielectric and/or metal.

BRIEF DESCRIPTION OF THE DRAWINGS

References are made to the following description taken in connection with the accompanying drawings, in which.

DETAILED DESCRIPTION OF THE PREFERRED EMBODIMENTS

Figure 1:
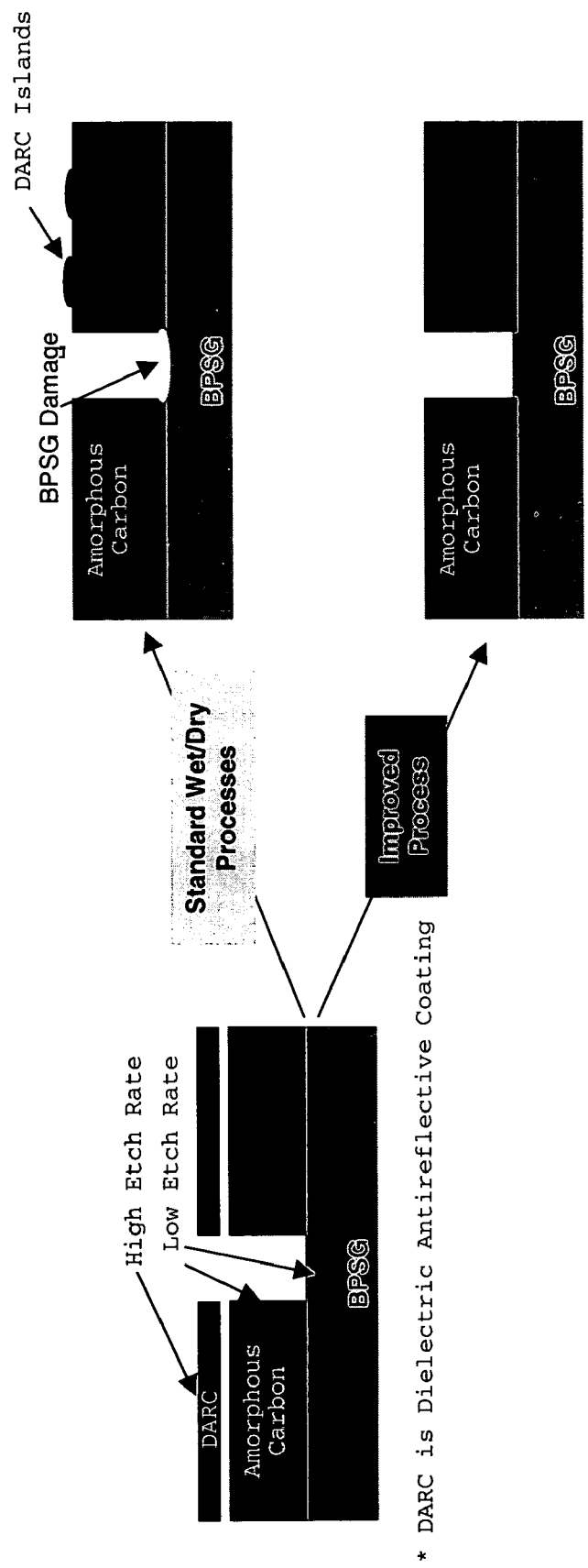
FIG. 1 depicts a cross sectional review of a layer of DARC in a selective etching application and nitride or carbide rich islands of DARC on the surface of the layer.

Various etching and cleaning compositions containing quaternary ammonium, phosphonium, or sulfonium fluoride formulations have been formulated to obtain improved etch rate, etch selectivity, etch uniformity and cleaning criteria on a variety of substrates.

The compositions preferably include a fluorine-containing compound such as a fluoride salt (e.g., a salt containing any type of fluoride, hydrogen fluoride, difluoride, etc.) as an active agent. The fluorine-containing compound can be a quaternary ammonium salt, a phosphonium salt, or a sulfonium salt, (i.e., more generally an "onium" salt), or it can be a salt that includes two or more quaternary onium groups linked together by one or more carbon-containing groups (e.g., "di-quats", "tri-quats", "tetraquats", etc.). The fluorine-containing compound preferably makes up between about 0.1% to about 20% by weight of the composition, more preferably between about 1% and about 10% by weight, and more preferably still between about 2% and about 7% by weight.

The composition may further include a pH adjusting acid such as a mineral acid, carboxylic acid, dicarboxylic acid, sulfonic acid, or combination thereof. The acid preferably makes up between about 0.1% to about 5% by weight of the composition, more preferably between about 0.1% and about 1% by weight, and more preferably still between about 0.1% and about 0.5% by weight. The resulting pH of the solution is typically between about 2 and about 9 and is preferably acidic. In some embodiments, the pH is between about 2 and about 7, and more preferably between about 2 and about 4.

The composition may further include an organic solvent such as an alcohol, amide, ether, or combination thereof. The solvent preferably makes up between about 1% to about 99.8% by weight of the composition, more preferably greater than about 80% by weight, and more preferably still greater than about 90% by weight.

The composition can also include water either as the primary solvent or in combination with an organic solvent. The composition may optionally be substantially anhydrous. It has been found that compositions having a very small water content are particularly suitable for certain semiconductor etching and cleaning applications, and the compositions used in these applications preferably have a water content of less than about 5% by weight, more preferably between about 0.5% and about 4%, and more preferably still between 1 and 3%.

The composition can optionally include a quaternary ammonium salt, a sulfonium salt, or a phosphonium salt in addition to the fluorine-containing compound. If present, this salt preferably makes up less than about 5% of the composition by weight, more preferably less than about 4% of the solution, and more preferably still between about 1% and about 3%.

Exemplary fluorine-containing compounds and salts suitable for use in the compositions of the present invention include Tetramethylammonium Fluoride, Tetrabutylammonium Fluoride, Methyltriphenylammonium Fluoride, Phenyltrimethylammonium Fluoride, Benzyltrimethylammonium Fluoride, Methtyltriethanolammonium Fluoride, Tetrabutylphosphonium Fluoride, Methyltriphenylphosphonium Fluoride, Trihexyltetradecylphosphonium Fluoride, Tributyltetradecylphosphonium Fluoride, Methyltriethanolammonium Hexafluorophosphate, Methyltriethanolammonium Tetrafluoroborate, Methyltriethanolammonium Dihydrogen Fluoride, Tetrabutylphosphonium Hexafluorophosphate, Tetrabutylphosphonium Tetrafluoroborate, Tetrabutylphosphonium Hydrogen Difluoride, Tetrabutylphosphonium Dihydrogen Trifluoride, [(CH3)3NCH2CH(OH)CH2N(CH3)3]2+ [F-]2, Betaine Hydrofluoride, 1-Butyl-3-methylimidazolium Fluoride, Trimethylsulfonium Fluoride, Trimethylsulfoxonium Fluoride, trimethyl (2,3-dihydroxypropyl) ammonium fluoride, [(C6H5)CH2N(CH3)2CH2CH(OH)CH2N(CH3)2CH2CH(OH)CH2N(CH3)2CH2NCH2(C6H5)]4+[F-]4, and [(CH3)3NCH2CH(OH)CH20H]+[F-], Hexamethonium difluoride. These compounds are merely examples, and the skilled artisan will understand (with the benefit of this Specification) that additional fluoride-containing compounds can be used in the present invention.

In one embodiment, the fluorine-containing compound is an alkanol quaterary ammonium fluoride. As used herein, an "alkanol group" is an akyl chain containing one or more hydroxy groups. Each alkanol group may be a hydroxylethyl, hydroxylbutyl, hydroxypropyl, 2,3 dihydroxypropyl etc. The alkanol quaternary ammonium fluoride can contains 1, 2, or 3 alkyl groups along with 3, 2, or 1 alkanol groups, respectively. The alkanol group may contain the hydroxy substituent(s) on the alpha, beta, gamma, etc., carbon position. In addition, alkanol or alkyl groups may bridge between adjacent quaternary ammonium cations to give diquats, triquats and multiquats. It is also envisioned that alkoxy groups could be acceptable in place of the hydroxy groups to give analogous alkoxy substituted quaternary ammonium or phosphonium fluorides.

Exemplary quaternary ammonium, sulfonium, and phosphonium salts that may optionally be included in the compositions in addition to the fluorine-containing compound include Tetramethylammonium Acetate, Tetrabutylammonium Chloride, Benzyltrimethylammonium Methanesulfonate, Methtyltriethanolammonium Benzoate, Tetrabutylphosphonium Salicylate, Trihexyltetradecylphosphonium Chloride, Tributyltetradecylphosphonium Fluoride, Methyltriethanolammonium Dihydrogen Phosphate, Methyltriethanolammonium Nitrate, Methyltriethanolammonium Sulfate, Tetrabutylphosphonium Phthalate, Tetrabutylphosphonium Acetate, Tetrabutylphosphonium Oxalate, Tetrabutylphosphonium Malonate, [(CH3)3NCH2CH(OH)CH2N(CH3)3] 2+Diacetate, Betaine, and 1-Butyl-3-methylimidazolium Acetate.

Exemplary pH adjusting acids that may be included in the compositions include Hydrofluoric acid, Hydrochloric Acid, Nitric Acid, Sulfuric Acid, Phosphoric Acid, Hydrobromic Acid, Perchloric Acid, Methanesulfonic Acid, Acetic Acid, Benzoic Acid, Octanoic Acid, Oxalic Acid, Salicylic Acid, Malonic Acid, Fluoroboric Acid, Hexafluorophosphoric Acid, Phenylphosphonic Acid, and Phytic Acid.

Exemplary solvents that may be included in the compositions include water, Tetrahydrofurfuryl Alcohol, Benzyl Alcohol, Hexanol, 2-(2-methoxyethoxy)-ethanol, Dimethylacetamide, Bis-(2-methoxyethyl) Ether, Octanoic Acid, Diethyleneglycol mono butyl ether, Glyme (including diglymes and monoglymes), Dipropyleneglycol mono methyl ether, 2-butoxyethanol, 1-Cyclohexyl-2-pyrrolidinone, and 1-Hydroxyethyl-2-pyrrolidinone. The organic solvent is preferably partially water-soluble.

The composition preferably is substantially free of metal ions, including sodium ions, potassium ions, and free metal ions to prevent wafer contamination. The solution components (e.g., salts, organic solvent) are preferably purified using ion exchange to remove metal ions. The organic solvents may also be purified via distillation or ion exchange. High purity acids can be purchased commercially. After purification, the composition preferably has a free metal ion content of less than about 200 parts per billion (PPB), more preferably less than about 20 PPB, more preferably less than about 10 PPB, and more preferably still less than about 5 PPB.

These compositions can be used for a variety of selective and non-selective etching and cleaning applications including those depicted in FIG. 1 to FIG. 3 and further discussed below.

Application 1 (FIG. 1) depicts the removal of dielectric antireflective coating (DARC; SiXOyNz) without significantly etching exposed boron and phosphorus doped (BPSG) oxide. The formulation used in this application preferably achieves a DARC etch rate of about 20–200 A/min (an etch rate of greater than 300 A/min may cause short dip times), with a 100 Å maximum loss on BPSG oxide with a selectivity of about 5:1 (DARC:BPSG) or greater.

Application 2 (FIG. 2A) depicts a pre-deposition and contact cleaning, non-selective etch of doped(BPSG):undoped tetraethylorthosilicate (TEOS) or like oxide. The formulation for this application preferably achieves a 1:1 selectivity of doped:undoped silicon oxide and an etch rate of about 5–30 Å/min.

Application 3 (FIG. 2B) depicts a pre-deposition and contact cleaning, selective etch of undoped/doped silicon oxide. The formulation for this application preferably achieves an undoped:doped selectivity equal to or greater than about 2:1 and an undoped etch rate of about 5–30 Å/min.

Application 4 (FIGS. 3A & 3B) depicts a cleaning of post etch residues from etched contacts, vias, and metal lines. The formulation for this application preferably achieves a low etch rate on dielectric and contact metal and high chemical compatibility with dielectric and associated barrier, cap, and etch stop materials.

Figure 2A:
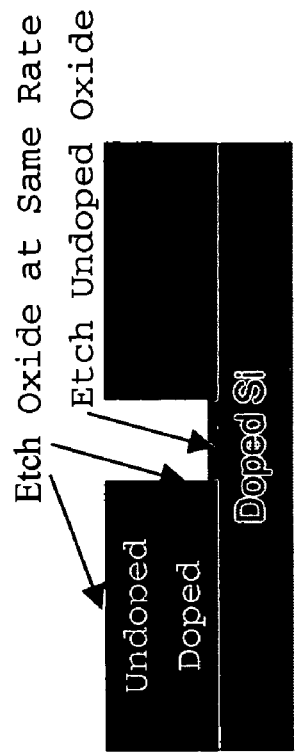
FIG. 2A depicts a layer of undoped oxide and doped oxide in a non-selective etching contact clean application (cross sectional view).
Figure 2B:
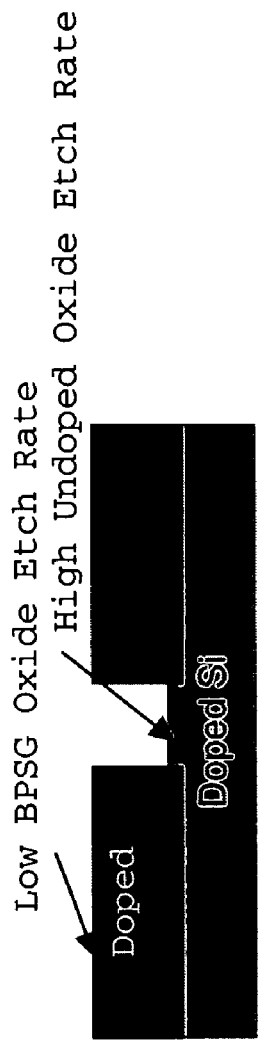
FIG. 2B depicts a layer of doped silicon oxide in a selective etching contact clean application (cross sectional view).
Figure 3B:
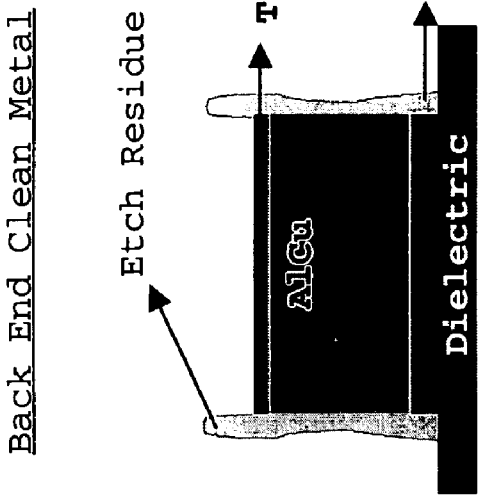
FIG. 3 depicts the cleaning of post etch residues from etched contacts, vias, and metal lines on a substrate (cross sectional view).
Figure 3A:
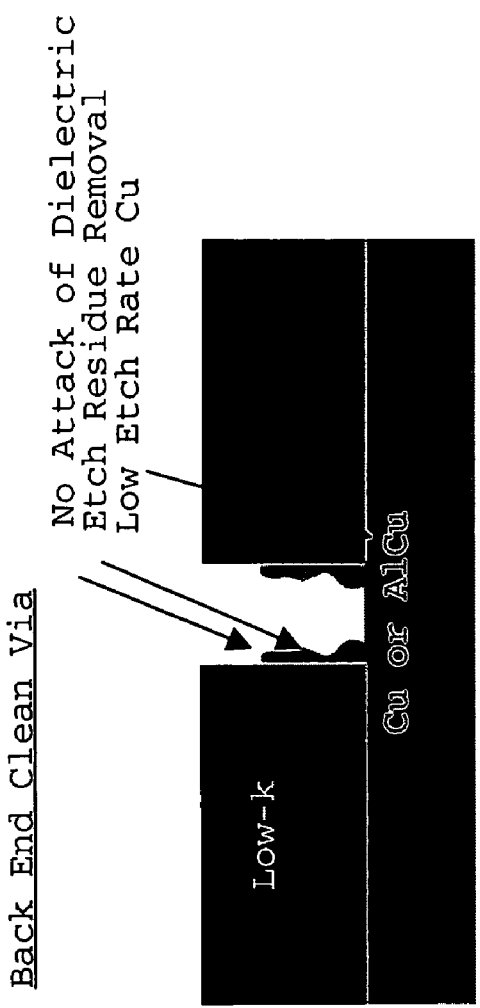

The high selectivity to undoped oxide etch formulations and the non-selective doped to undoped etch formulations can be used to clean plasma etched structures of varying architecture as depicted in FIG. 2A and FIG. 2B. The formulations can also be used for cleaning applications including post etch residue removal on metal exposed structures such as vias stopping on copper or AlCu and AlCu metal lines as shown in FIG. 3A and FIG. 3B.

EXAMPLES

The composition used in Example 17 was formulated by the following steps:

(1) 7.33 g of HF (Air Products 48.9%; Lot 3067035P) was slowly added with stirring to 89.79 g of Tetrabutylphosphonium Hydroxide (Sachem 39.97%; Lot A30761012503). Heat was generated during this neutralization step.

(2) The resulting solution was diluted with diethyleneglycol monobutyl ether (ACROS; 99+%, <0.1% H20) to a final mass of 326.8 g. The resulting solution was approximately 18.3% water, 10.97% tetrabutyl phosphonium fluoride, 0.305% HF, and 70.42% diethyleneglycol monobutyl ether.

(3) The resulting solution was placed in a teflon coated round bottom flask and rotovaped at 85° C. @40 Torr (or better) until the water content dropped to 3.1% (total time 33 minutes).

(4) This solution, having a mass of 277.82 g, was diluted 3.6 fold (to 1000.14 g) with diethyleneglycol monobutyl ether, resulting in the formulation used in Example 1. The other formulations in Table 1 below were made in a similar manner.

The following films were tested using the compositions listed in Table 1 below:

(1) 6000 Å 3.0%×6.0% boron and phosphorus (BPSG) doped oxide;

(2) 1050 Å dielectric antireflective coating (DARC; SiOxNy);

(3) 2300 Å Plasma enhanced chemical vapor deposition (PECVD TEOS) oxide;

(4) 5000 Å 5.0% Phosphorus doped oxide (PSG); and (5) 5000 Å Thermal oxide (THox);

The DARC, BPSG, PSG, TEOS etc. wafers were cleaved into 1"×1" square pieces. The pieces were submerged into plastic beakers containing the etchant solutions at 25–70° C. The wafer pieces were processed for 10–30 min after which they were rinsed with isopropyl alcohol then DI water and blown dry with nitrogen. The film thicknesses before and after processing were determined by reflectometry using a NANOSPEC 210. The films were also examined by optical microscopy to assess uniformity of etch.

The results for etch rate, selectivity and film removal uniformity (DARC) are presented in Table 1. The results in Table 1 represent some of the preferred formulations based upon over 800 formulations tested. It is to be understood that formulations in Table 1 are merely examples of the present invention, which is not to be limited to the specific components or percentages in this description. One of ordinary skill will appreciate, with the benefit of this specification, that many other formulations could be made that fall within the scope of the invention described herein that contain only insubstantial variations to the illustrative embodiments found in Table 1. The metes and bounds of the invention are to be ascertained from the appended claims rather than from the specific illustrative embodiments set forth in this description.

Figure 4:
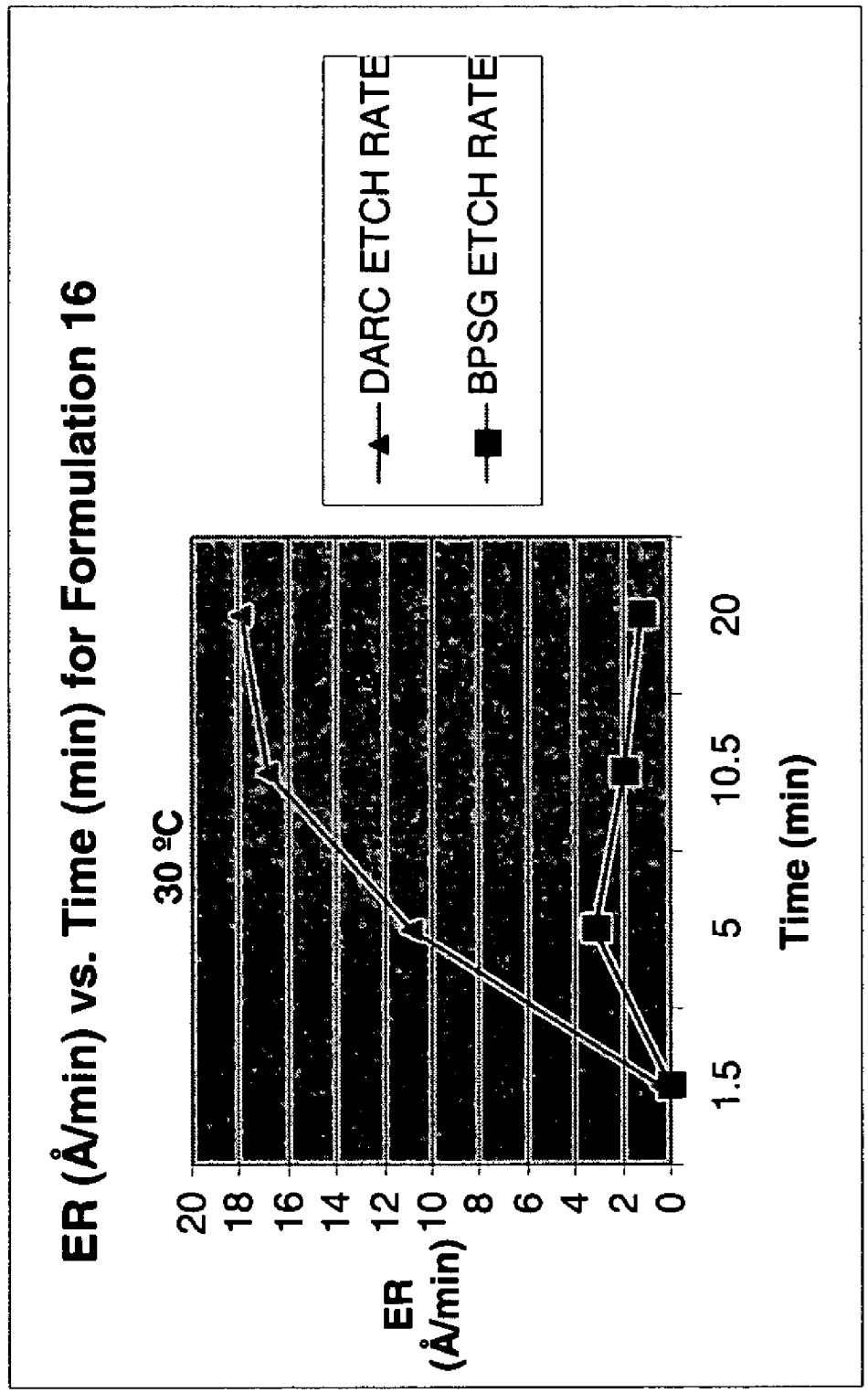
FIG. 4 is a graph of etch rate versus time for a selected composition on a DARC substrate and a BPSG substrate.
Figure 5:
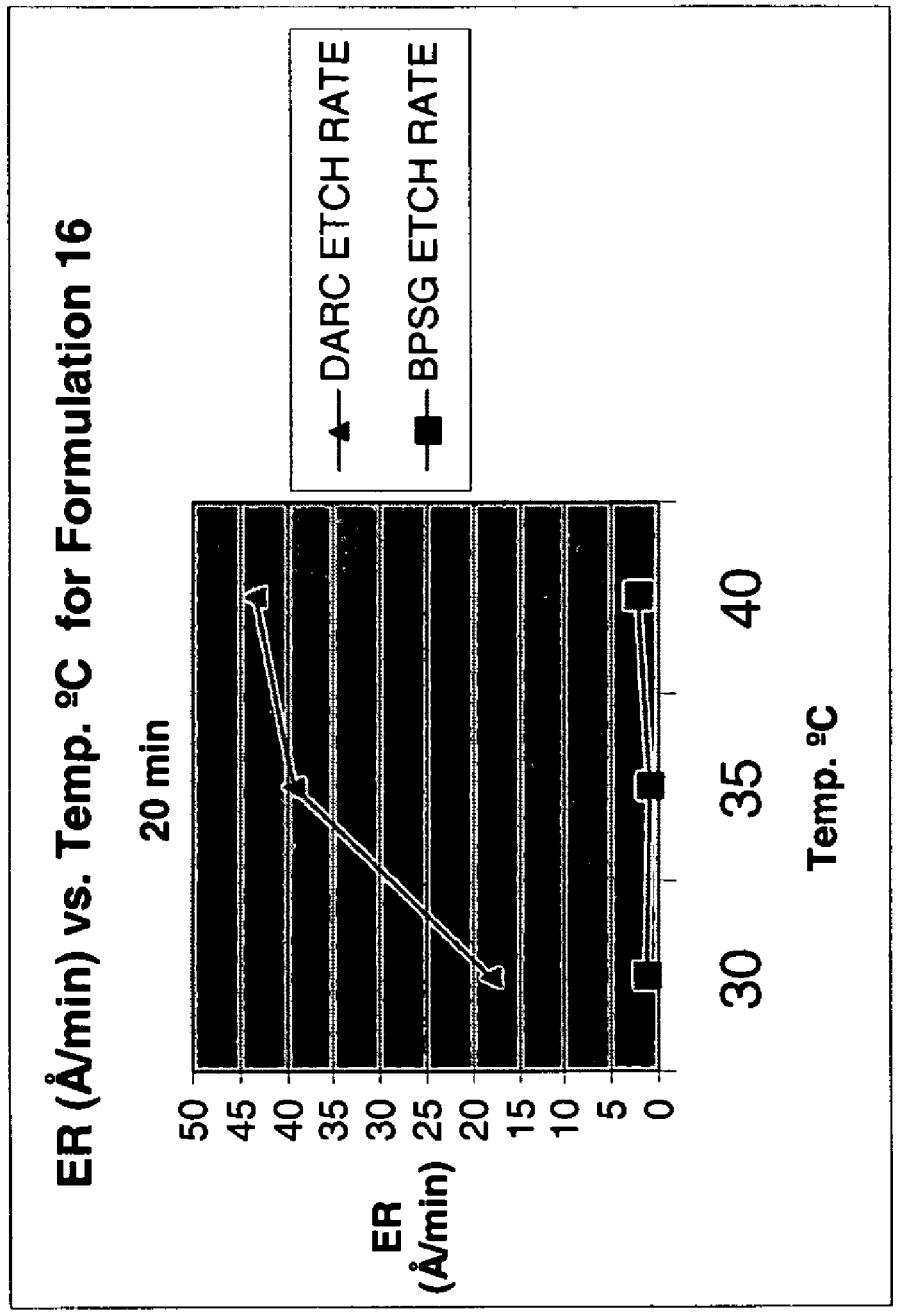
FIG. 5 is a graph of etch rate versus temperature for a selected composition on a DARC substrate and a BPSG substrate.
Figure 6:
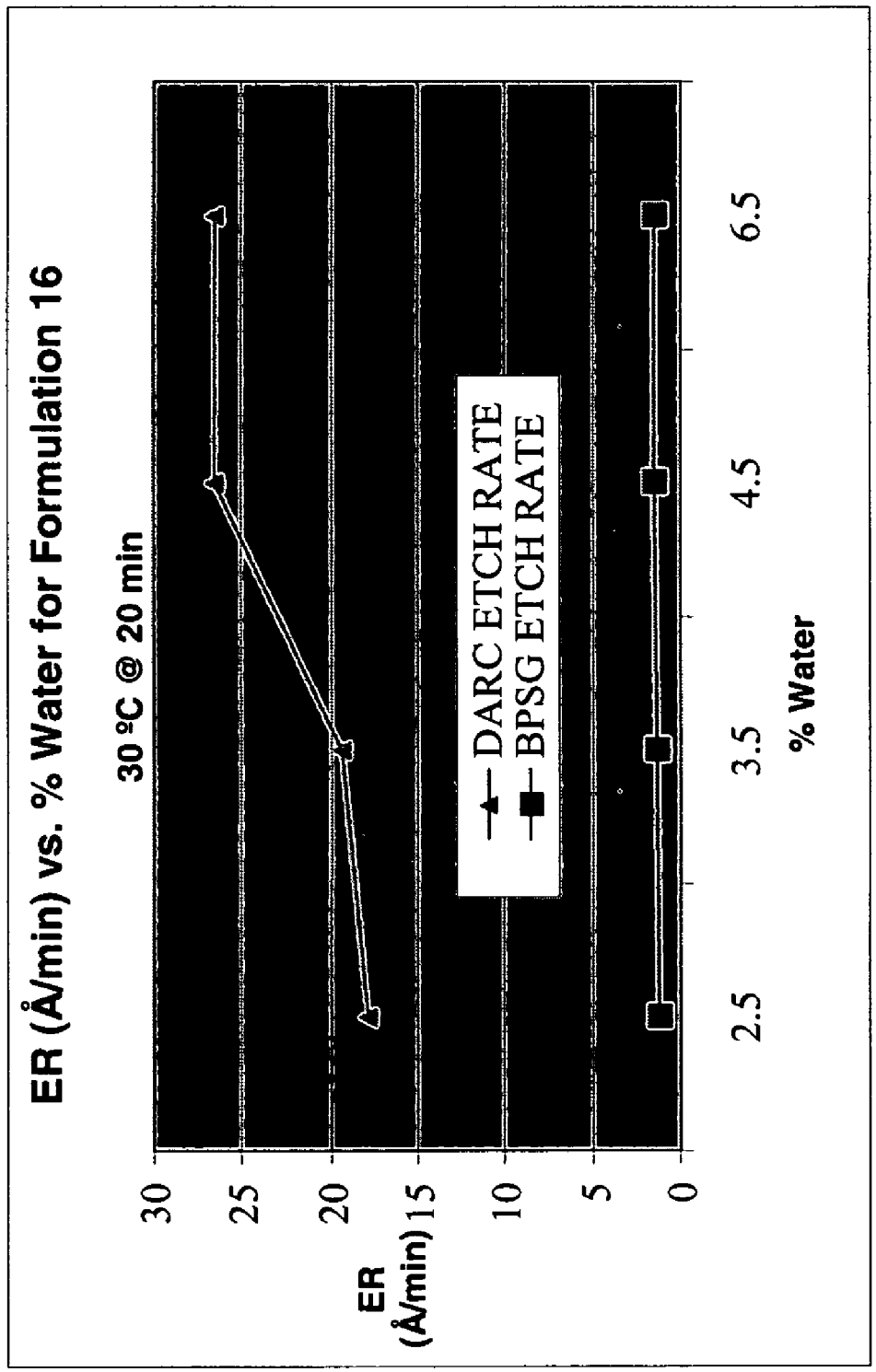
FIG. 6 is a graph of etch rate versus percentage water for a selected composition on a DARC substrate and a BPSG substrate.
Figure 7:
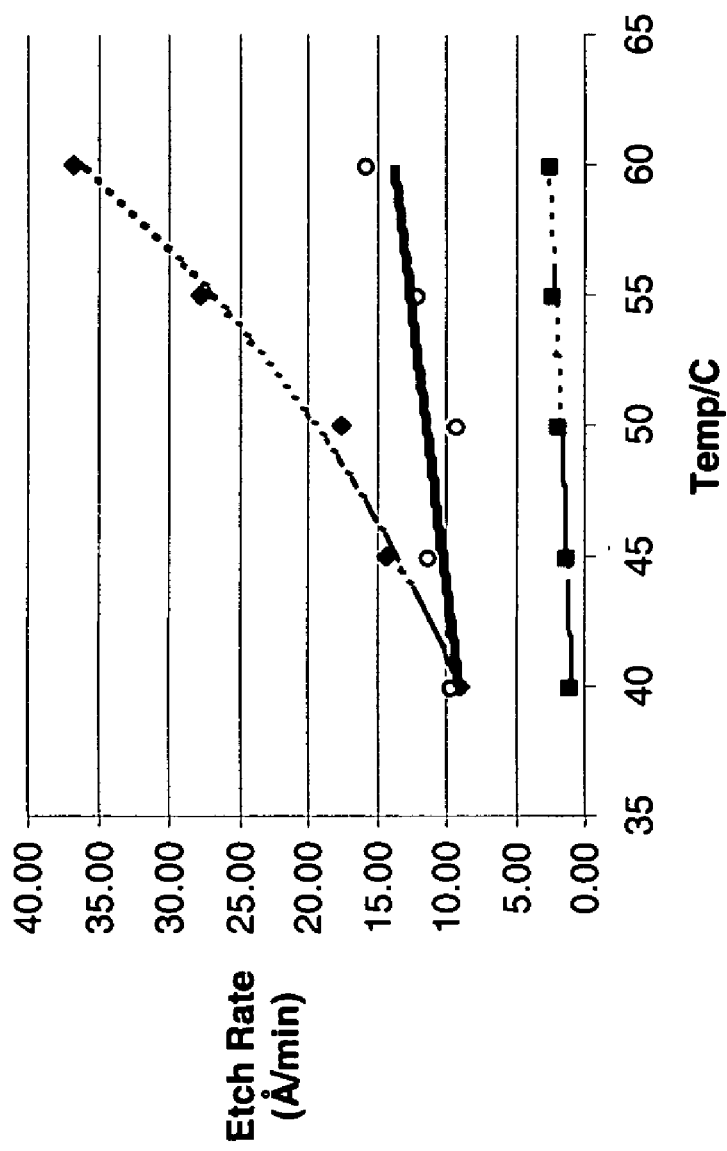
FIG. 7 is a graph of etch rate versus temperature for a selected composition on a DARC substrate and a BPSG substrate.
Figure 8:
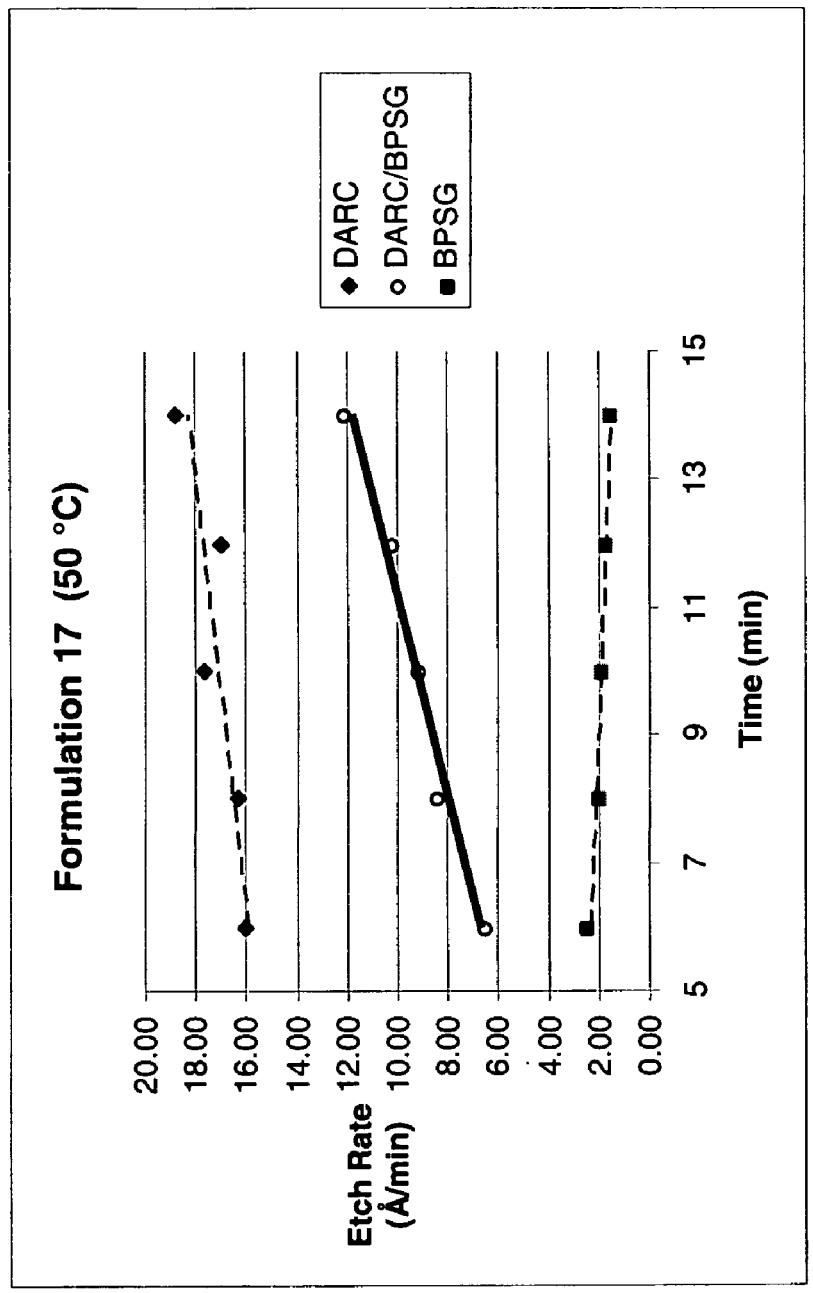
FIG. 8 is a graph of etch rate versus time for a selected composition on a DARC substrate and a BPSG substrate.
Figure 9:
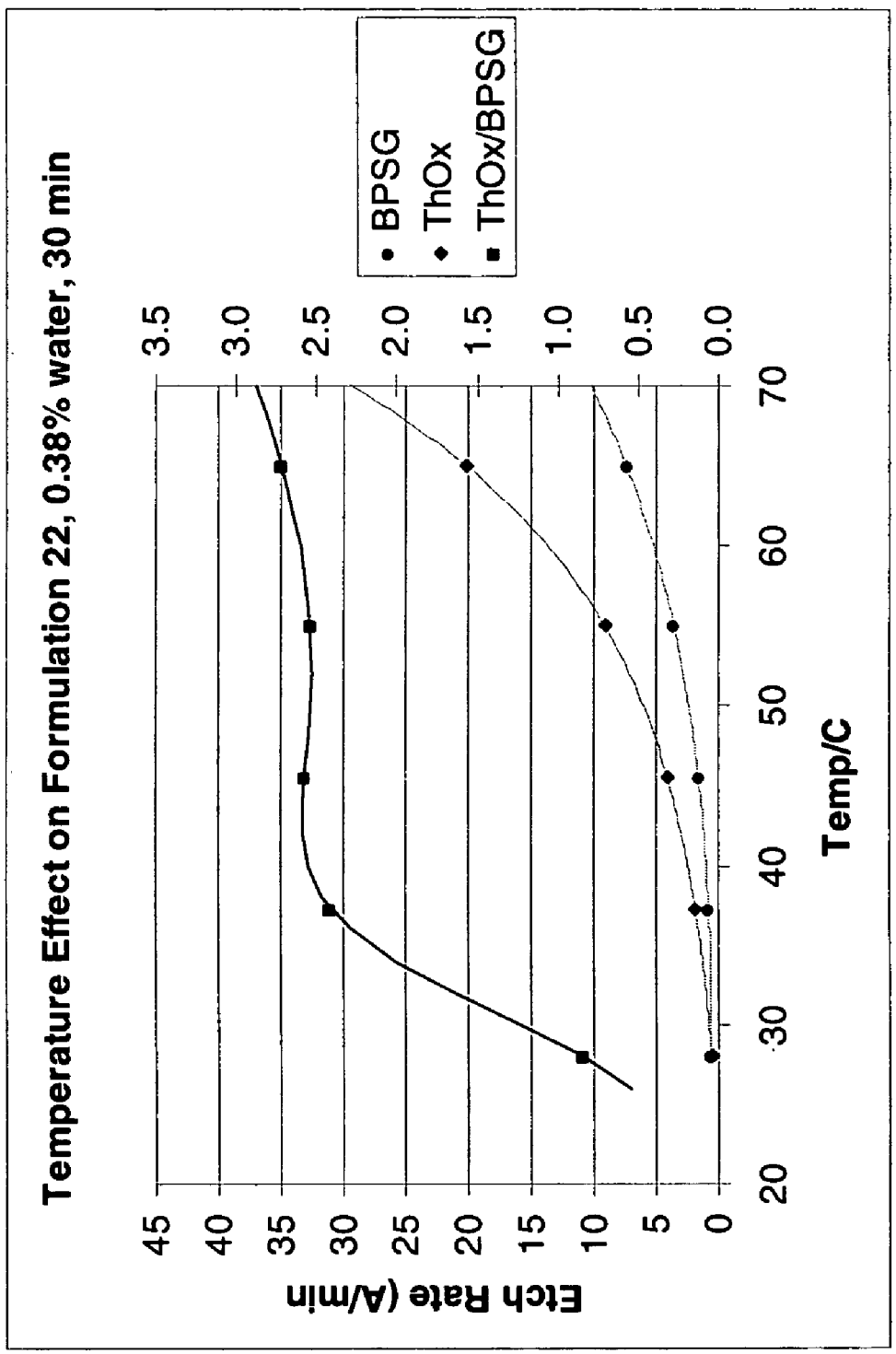
FIG. 9 is a graph of etch rate versus temperature for a selected composition on a ThOx substrate and a BPSG substrate.
Figure 10:
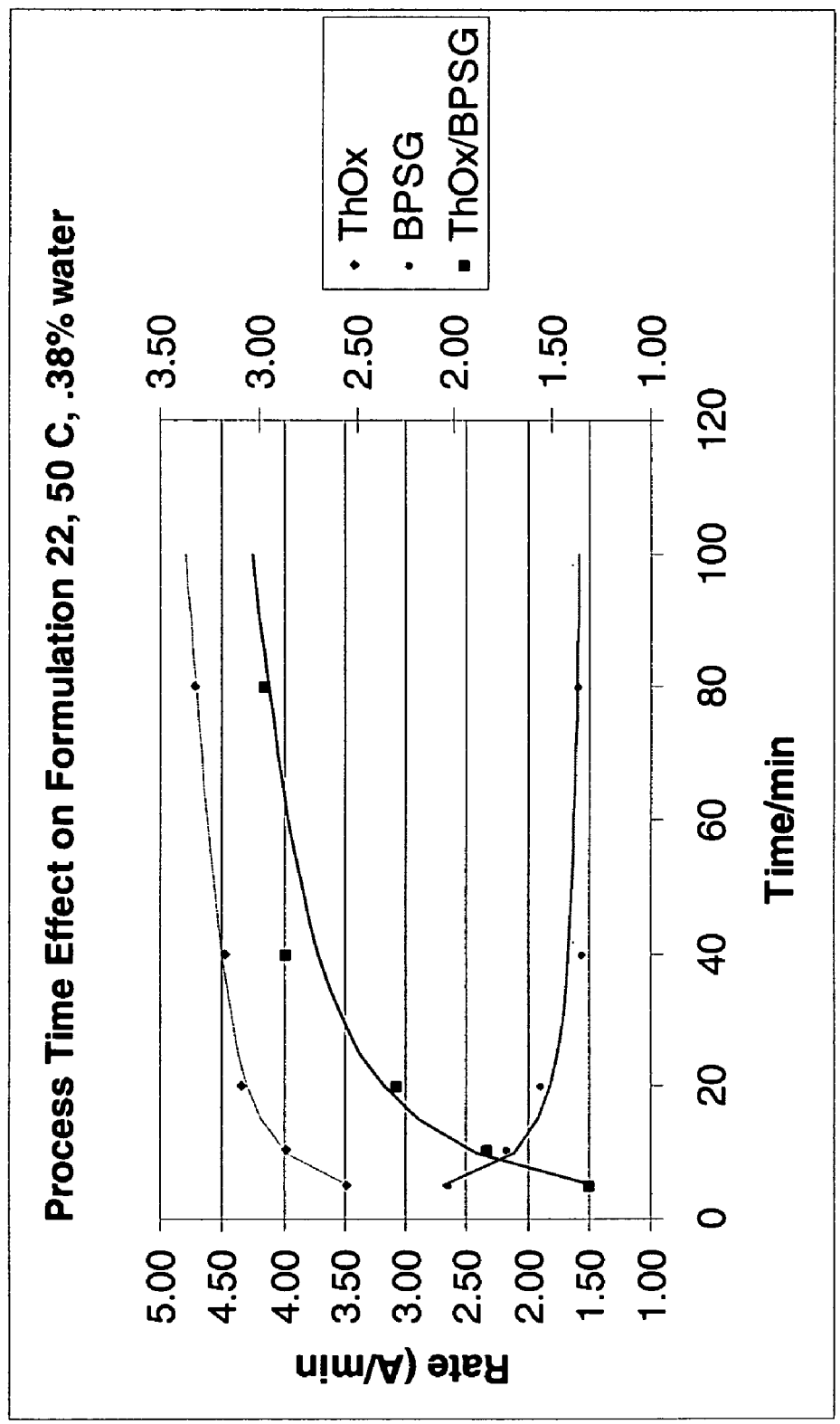
FIG. 10 is a graph of etch rate versus time for a selected composition on a ThOx substrate and a BPSG substrate.

The etching and selectivity characteristics of the formulation of Example 16 were studied versus process temperature, process time and water content. This data is presented in FIGS. 4, 5, and 6. The etch rate and selectivity characteristics of the formulations of Example 17 and Example 22 versus process temperature and process time are provided in FIGS. 7–8 and 9–10, respectively.

TABLE 1

All Processes at 30° C. unless otherwise indicated

| Example Formulation | Film | Process Time (min) | Etch Rate (Å/min) | Sel., DARC:BPSG | Sel., TEOS or Thox:BPSG | Formulation Chemistry (weight percentages) |
|---|---|---|---|---|---|---|
| 1 | DARC | 30 min | 7.9 | 8.8 | | 4.5%-[$CH_3N(CH_2CH_2OH)_3$]$^+$ [$F^-$] |
| | TEOS | 30 min | 4.3 | | 4.8 | <0.1% HCl to adjust pH = 5 |
| | BPSG | 30 min | 0.9 | | | 95.4% $H_2O$ |
| 2 | TEOS | 30 min | 29.1 | — | | 4.5%-[$CH_3N(CH_2CH_2OH)_3$]$^+$ [$F^-$] |
| | BPSG | 30 min | 6.6 | | 4.4 | <0.5% Acetic Acid |
| | | | | | | 95% $H_2O$ |
| | | | | | | pH = 4 |
| 3 | TEOS | 30 min | 22.4 | — | | 4.5%-[$CH_3N(CH_2CH_2OH)_3$]$^+$ [$F^-$] |
| | BPSG | 30 min | 6.2 | | 3.6 | <0.5% Acetic Acid |
| | | | | | | 95% $H_2O$ |
| | | | | | | pH = 3.6 |
| 4 | DARC | | 10.9 | 5.5 | | 4.2%-[$(CH_3)_3N(CH_2C_6H_5)$]$^+$ [$F^-$] |
| | TEOS | | 6.6 | | 3.3 | <0.1% HCl to adjust pH = 5 |
| | BPSG | | 2.0 | | | 95.7% $H_2O$ |
| 5 | TEOS | 30 min | 54.6 | — | | 3.55%-1-Butyl-3-methylimidazoliium fluoride |
| | BPSG | 30 min | 13.8 | | 3.96 | 2.6% 1-Butyl-3-methylimidazoliium methansulfonate |
| | | | | | | <1% Methanesulfonic Acid |
| | | | | | | 92.8% $H_2O$ |
| | | | | | | pH = 3.9 |
| 6 | TEOS | 30 min | 72.2 | — | 1.03 | 0.21% [$(CH_3)_3NCH_2CH(OH)CH_2N—(CH_3)_3$]$^{2+}$ [$F^-$]$_2$ |
| | BPSG | 30 min | 70.0 | | | 0.16%-HF |
| | | | | | | 99.63% $H_2O$ |
| | | | | | | pH = 2.54 |
| 7 | TEOS | 30 min | 34.5 | — | | 1.15% [$CH_3N(CH_2CH_2OH)_3$]$^+$ [$F^-$] |
| | BPSG | 30 min | 34.6 | | 1 | 0.75% $H_3PO_4$ |
| | PSG | 30 min | 32 | | | 98.1% $H_2O$ |
| | | | | | | pH = 2.3 |
| 8 | TEOS | 30 min | 31.3 | — | 3.7 | 4.57% [$CH_3N(CH_2CH_2OH)_3$]$^+$ [$F^-$] |
| | BPSG | 30 min | 8.5 | | | <0.2% Methane Sulfonic |
| | | | | | | 95.23% $H_2O$ |
| | | | | | | pH = 4.0 |
| 9 | TEOS | 30 min | 45.7 | — | 2.7 | 4.57%-[$CH_3N(CH_2CH_2OH)_3$]$^+$ [$F^-$] |
| | BPSG | 30 min | 17.2 | | | <0.5% Benzoic Acid |
| | | | | | | 94.93% $H_2O$ |
| | | | | | | pH = 4.0 |
| 10 | TEOS | 30 min | 9 | — | 7.5 | 6.95%-[$P(CH_2CH_2CH_2CH_3)_4$]$^+$ [$F^-$] |
| | BPSG | 30 min | 1.2 | | | 92.95% $H_2O$ |
| | | | | | | <0.1% HCl |
| | | | | | | pH = 3.9 |
| 11 | TEOS | 30 min | 14.1 | — | 12.8 | 12.6%-$CH_3(CH_2)_{13}P((CH_2)_5CH_3)_3$]$^+$ [$F^-$] |
| | BPSG | 30 min | 1.1 | | | 87.3% $H_2O$ |
| | | | | | | <0.1% HCl |
| | | | | | | pH = 4.0 |

TABLE 1-continued

All Processes at 30° C. unless otherwise indicated

| Example Formulation | Film | Process Time (min) | Etch Rate (Å/min) | Sel., DARC:BPSG | Sel., TEOS or Thox:BPSG | Formulation Chemistry (weight percentages) |
|---|---|---|---|---|---|---|
| 12 | DARC | 30 min | 19.3 | 32 | | 2.3% $[N(CH_3)_4]^+ [F^-]$ |
| | TEOS | 30 min | 7.2 | | 12 | 95.1% Tetrahydrofurfuryl alcohol |
| | BPSG | 30 min | 0.6 | | | 2.5% $H_2O$ |
| | | | | | | <0.1% HCl |
| | | | | | | pH = 4.0 (on 5:1 dilution with $H_2O$) |
| 13 | DARC | 30 min | 34 | 8.3 | | 2.3% $[N(CH_3)_4]^+ [F^-]$ |
| | TEOS | 30 min | 20.2 | | 4.9 | 95% Tetrahydrofurfuryl alcohol |
| | BPSG | 30 min | 4.1 | | | 2.7% $H_2O$ |
| | | | | | | <0.2% HCl |
| | | | | | | pH = 3.1 (on 5:1 dilution with $H_2O$) |
| 14 | DARC | 30 min | 3.2 | 5.3 | | 6.5% $[N(CH_2CH_2CH_2CH_3)_4]^+ [F^-]$ |
| | TEOS | 30 min | 7.3 | | 12 | 91.6% Dimethylacetamide |
| | BPSG | 30 min | 0.6 | | | 1.7% $H_2O$ |
| | | | | | | <0.2% HCl |
| | | | | | | pH = 3.04 (on 5:1 dilution with $H_2O$) |
| 15 | DARC | 30 min | 33.9 | 11 | | 2.3% $[N(CH_3)_4]^+ [F^-]$ |
| | TEOS | 30 min | 15 | | 5 | 94.8% Benzyl Alcohol |
| | BPSG | 30 min | 3.1 | | | 2.7% $H_2O$ |
| | | | | | | <0.2% HCl |
| | | | | | | pH = 3.5 (on 5:1 dilution with $H_2O$) |
| 16 | DARC | 20 min | 17.9 | 15 | | 2.3% $[N(CH_3)_4]^+ [F^-]$ |
| | TEOS | 20 min | 4.3 | | 3.6 | 95% 2-(2-methoxyethoxy)-ethanol |
| | BPSG | 20 min | 1.21 | | | 2.5% $H_2O$ |
| | | | | | | <0.2% HCl |
| | | | | | | pH = 3.6 (on 5:1 dilution with $H_2O$) |
| 17 (50° C. Process) | DARC | 10 min | 22 | 10.5 | | 3.34%-$[P(CH_2CH_2CH_2CH_3)_4]^+ [F^-]$ |
| | BPSG | 10 min | 2.1 | | | <0.9% $H_2O$ |
| | | | | | | 0.09% HF |
| | | | | | | 95.7% diethylene glycol monobutyl ether |
| | | | | | | pH = 3.3 (after 50:1 dilution deionized water) |
| 18 (50° C. Process) | DARC | 10 min | 29 | 15.3 | — | 6.95%-$P(CH_2CH_2CH_2CH_3)_4]^+ [F^-]$ |
| | BPSG | 10 min | 1.9 | | | 10% $H_2O$ |
| | | | | | | 0.16% HF |
| | | | | | | 83% dipropyleneglycol mono methyl ether |
| 19 (50° C. Process) | Thox | 15 min | 6.8 | — | | 6.95%-$P(CH_2CH_2CH_2CH_3)_4]^+ [F^-]$ |
| | TEOS | 15 min | 24.2 | | 7.3 | 2% Benzoic Acid |
| | BPSG | 15 min | 3.3 | | | 91.05% diethyleneglycol mono methyl ether |
| | | | | | | pH = 3.6 (after 50:1 dilution deionized water) |
| | PSG | 15 min | 4.3 | | | |
| 20 (40° C. Process) | DARC | 30 min | 17.9 | 16.2 | | 6.95%-$P(CH_2CH_2CH_2CH_3)_4]^+ [F^-]$ |
| | BPSG | 30 min | 1.1 | | — | <0.2% HCl |
| | | | | | | 82.3% diethyleneglycol mono methyl ether |
| | | | | | | 10.5% $H_2O$ |
| | | | | | | pH = 3.5 (after 50:1 dilution deionized water) |
| 21 (50° C. Process) | DARC | 30 min | 17.2 | 34.4 | | 4.17%-$P(CH_2CH_2CH_2CH_3)_4]^+ [F^-]$ |
| | BPSG | 30 min | 0.5 | | — | <0.1% HF |
| | | | | | | ≧93.7% Tetrahydrofurfuryl alcohol |
| | | | | | | <2% $H_2O$ |
| | | | | | | pH = 3.5 (after 50:1 dilution deionized water) |
| 22 (50° C. Process) | ThOx | 30 min | 6.9 | — | 2.46 | 1.38%-$P(CH_2CH_2CH_2CH_3)_4]^+ [F^-]$ |

TABLE 1-continued

All Processes at 30° C. unless otherwise indicated

| Example Formulation | Film | Process Time (min) | Etch Rate (Å/min) | Sel., DARC:BPSG | Sel., TEOS or Thox:BPSG | Formulation Chemistry (weight percentages) |
|---|---|---|---|---|---|---|
| | BPSG | 30 min | 2.8 | | | 0.56% $P(CH_2CH_2CH_2CH_3)_4]^+$ [Benzoate$^-$] 3% Benzoic acid 95% diethyleneglycol monomethyl ether <0.2% $H_2O$ pH = 3.5 (after 50:1 dilution deionized water) |

What is claimed is:

1. A composition useful for cleaning or etching a substrate, comprising:
   tetrabutyl phosphonium fluoride;
   an acid;
   an organic solvent or water or a mixture thereof in an amount from 0 to about 99.8% of the composition by weight; and
   a pH of between about 2 and about 9.

2. The composition of claim 1, wherein the salt makes up between about 1% and about 10% by weight of the composition.

3. The composition of claim 1, wherein the organic solvent is an alcohol.

4. The composition of claim 1, wherein the organic solvent is a glyme.

5. The composition of claim 1, wherein the water makes up less than about 5% of the composition by weight.

6. The composition of claim 1, wherein the pH is between about 2 and about 4.

7. The composition of claim 1, further comprising a second salt comprising one or more of a quaternary ammonium salt, a sulfonium salt, and a phosphonium salt.

8. The composition of claim 1, wherein the composition has a free metal ion content of less than about 10 PPB.

9. The composition of claim 1, wherein the composition is capable of etching a DARO layer at a rate greater than it etches a doped oxide layer.

10. The composition of claim 1, wherein the composition is capable of etching an undoped oxide layer at a rate greater than it etches a doped oxide layer.

11. The composition of claim 1, wherein the composition is capable of non-selectively etching a doped oxide layer and an undoped oxide layer.

12. The composition of claim 1, wherein the solvent is a glyme, the water is present in an amount less than about 3%, and the pH is between about 2.5 and about 4.

13. The composition of claim 1, wherein the composition further comprises tetrabutyl phosphonium benzoate.

14. A composition for cleaning or etching a semiconductor substrate, comprising:
   a salt containing fluoride and a quaternary ammonium cation comprising at least one alkoxy group or two or more quaternary ammonium groups linked together by one or more carbon-containing groups; an acid;
   a solvent comprising water in an amount from 0 to about 99.8% of the weight of the formulation or an organic solvent in an amount from 0 to 99.8% of the weight of the formulation or a mixture thereof; and
   a pH of between about 2 and about 9.

15. A composition for cleaning or etching a substrate, obtained by combining ingredients comprising:
   a salt containing fluoride and a phosphonium cation;
   an acid;
   an organic solvent, wherein the organic solvent is one or more selected from the group consisting of tetrahydrofurfuryl alcohol, benzyl alcohol, hexanol, 2-(2-methoxyethoxy)-ethanol, dimethylacetamide, bis-(2-methoxyethyl) ether, diethyleneglycol mono butyl ether, glymes, dipropyleneglycol mono methyl ether, 2-butoxyethanol, 1-cyclohexyl-2-pyrrolidinone, 1-hydroxyethyl-2-pyrrolidinone; and
   water as the primary solvent;
   wherein the composition has a pH of between about 2 and about 9.

16. A composition for cleaning or etching a substrate, obtained by combining ingredients comprising:
   a salt containing fluoride and a quaternary ammonium cation comprising at least one alkoxy group or a cation comprising two or more quaternary ammonium groups linked together by one or more carbon-containing groups;
   an acid;
   an organic solvent; and
   water in an amount less than about 5% of the composition by weight;
   wherein the composition has a pH of between about 2 and about 9.

17. A method for cleaning and/or etching and/or patterning a semiconductor substrate, comprising:
   contacting the semiconductor substrate with a composition comprising:
   tetrabutyl phosphonium fluoride;
   an acid;
   an organic solvent or water or a mixture thereof in an amount from 0 to about 99.8% of the composition by weight; and
   a pH of between about 2 and about 9.

18. The method of claim 17, wherein the substrate comprises an antireflective coating, amorphous carbon and BPSG, wherein the process further comprises etching a portion of the antireflective coating, and wherein the composition etches the antireflective coating at a rate greater than that at which it removes the amorphous carbon or the BPSG.

19. A method of cleaning and/or etching and/or patterning a semiconductor substrate, comprising:
   contacting the semiconductor substrate with a composition obtained by combining ingredients comprising:
   tetrabutyl phosphonium fluoride;
   an acid;

an organic solvent or water or a mixture thereof in an amount from 0 to about 99.8% of the composition by weight; and a pH of between about 2 and about 9.

20. The method of claim 17, wherein the process further comprises:
(a) etching a dielectric to expose a contact material on the substrate, thereby forming a residue; and
(b) contacting the contact material with a cleaning formulation to remove the residue, wherein the contact material comprises one or more of a metal, doped silicon, polysilicon, and silicide.

21. The method of claim 19, wherein the process further comprises:
(a) etching a dielectric to expose a contact material on the substrate, thereby forming a residue; and
(b) contacting the contact material with a cleaning formulation to remove the residue, wherein the contact material is comprises one or more of a metal, doped silicon, polysilicon, and silicide.

22. The method of claim 17, wherein the process comprises:
(a) etching a metal to form an interconnect metal line, thereby forming a residue;
(b) contacting the metal with the composition to remove the residue.

23. The method of claim 19, wherein the process comprises:
(a) etching a metal to form an interconnect metal line, thereby forming a residue; and
(b) contacting the metal with the composition to remove the residue.

24. The method of claim 19, wherein the substrate comprises an antireflective coating, amorphous carbon and BPSG, wherein the process further comprises etching a portion of the antireflective coating, and wherein the composition etches the antireflective coating at a rate greater than that at which it removes the amorphous carbon or the BPSG.

25. A method of cleaning and/or etching and/or patterning a semiconductor substrate, comprising contacting the semiconductor substrate with the composition of claim 14.

26. A method of cleaning and/or etching and/or patterning a semiconductor substrate, comprising contacting the semiconductor substrate with the composition of claim 16.

27. A method of cleaning and/or etching and/or patterning a semiconductor substrate, comprising contacting the semiconductor substrate with the composition of claim 15.

28. The composition of claim 15 wherein the acid is present in an amount from about 0.1% to about 5% by weight of the composition.

29. The composition of claim 15 wherein the salt is present in an amount from about 0.1% to about 20% by weight of the composition.

30. The composition of claim 15 wherein the acid is a mineral acid or a sulfonic acid.

* * * * *